(12) United States Patent
Janesch et al.

(10) Patent No.: US 7,932,784 B1
(45) Date of Patent: Apr. 26, 2011

(54) FREQUENCY AND PHASE LOCKED LOOP SYNTHESIZER

(75) Inventors: Stephen T. Janesch, Greensboro, NC (US); William J. Farlow, Lewisville, NC (US); Scott Robert Humphreys, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 501 days.

(21) Appl. No.: 11/854,917

(22) Filed: Sep. 13, 2007

Related U.S. Application Data

(63) Continuation-in-part of application No. 11/082,277, filed on Mar. 17, 2005, now Pat. No. 7,279,988.

(60) Provisional application No. 60/825,479, filed on Sep. 13, 2006.

(51) Int. Cl.
*H03L 7/06* (2006.01)
(52) U.S. Cl. ............................................. 331/10; 331/11
(58) Field of Classification Search .................... 331/10, 331/11
See application file for complete search history.

(56) References Cited

U.S. PATENT DOCUMENTS

| | | | |
|---|---|---|---|
| 3,538,450 A | | 11/1970 | Andrea et al. |
| 4,580,107 A | * | 4/1986 | Caldwell et al. ............... 331/10 |
| 5,446,416 A | * | 8/1995 | Lin et al. ......................... 331/11 |
| 5,493,715 A | | 2/1996 | Humphreys et al. |
| 5,631,592 A | | 5/1997 | Schwarz et al. |
| 6,016,080 A | | 1/2000 | Zuta et al. |
| 6,326,961 B1 | | 12/2001 | Lin et al. |
| 6,710,664 B2 | | 3/2004 | Humphreys et al. |
| 7,023,282 B1 | | 4/2006 | Humpreys et al. |
| 7,064,591 B1 | | 6/2006 | Humphreys et al. |
| 7,098,754 B2 | | 8/2006 | Humphreys et al. |
| 2004/0183601 A1 | * | 9/2004 | Zhang .............................. 331/16 |
| 2005/0057290 A1 | * | 3/2005 | Dalton et al. ................. 327/156 |
| 2008/0231375 A1 | | 9/2008 | Welz et al. |

OTHER PUBLICATIONS

Kral, A. et al., "RF-CMOS Oscillators with Switched Tuning," IEEE 1998 Custom Integrated Circuits Conference, 1998, pp. 555-558, IEEE.
Wilson, William B., et al., "A CMOS Self-Calibrating Frequency Synthesizer," IEEE Journal of Solid-State Circuits, Oct. 10, 2000, pp. 1437-1444, vol. 35, No. 10, IEEE.
U.S. Appl. No. 11/082,277, now U.S. Patent No. 7,279,988, Notice of Allowance mailed May 31, 2007.
U.S. Appl. No. 11/082,277, now U.S. Patent No. 7,279,988, Final Rejection mailed Apr. 13, 2007.
U.S. Appl. No. 11/082,277, now U.S. Patent No. 7,279,988, Nonfinal Rejection mailed Nov. 3, 2006.
U.S. Appl. No. 12/251,757, now U.S. Patent No. 7,750,685, Notice of Allowance mailed Mar. 29, 2010.

\* cited by examiner

*Primary Examiner* — Joseph Chang
(74) *Attorney, Agent, or Firm* — Withrow & Terranova, P.L.L.C.

(57) ABSTRACT

The present invention is a frequency and phase locked loop (FPLL) synthesizer having a frequency-locked loop (FLL) operating mode and a phase-locked loop (PLL) operating mode. The FLL operating mode is used for rapid coarse tuning of the FPLL synthesizer and is followed by the PLL operating mode for fine tuning and stabilization of the frequency of an output signal from the FPLL synthesizer. The FPLL synthesizer includes a variable frequency oscillator, which is controlled by FLL circuitry during the FLL operating mode or by PLL circuitry during the PLL operating mode. The FLL circuitry includes frequency division circuitry for reducing the frequency of the output signal, frequency detection circuitry for measuring the frequency error of the frequency reduced output signal, and a loop filter to control the bandwidth of an FLL control loop formed by the FLL circuitry and the variable frequency oscillator.

21 Claims, 11 Drawing Sheets

FREQUENCY AND PHASE LOCKED LOOP SYNTHESIZER

This application is a Continuation-in-Part of U.S. utility application Ser. No. 11/082,277 entitled DIGITAL FREQUENCY LOCKED LOOP AND PHASE LOCKED LOOP FREQUENCY SYNTHESIZER, filed Mar. 17, 2005, currently pending, the disclosure of which is incorporated herein by reference in its entirety.

This application claims the benefit of provisional patent application Ser. No. 60/825,479 entitled FREQUENCY LOCKED-LOOP COARSE TUNING, filed Sep. 13, 2006, the disclosure of which is hereby incorporated by reference in its entirety.

FIELD OF THE INVENTION

The present invention relates to frequency synthesizers in general and in particular to frequency-locked and phase-locked loop synthesizers, which may be used in radio frequency (RF) circuitry.

BACKGROUND OF THE INVENTION

Conventional frequency synthesizers generally include a phase-locked loop (PLL). A PLL is a device that generates an output frequency that is a function of a reference frequency. When implemented in a device such as a wireless transceiver, the output frequency of the PLL may change frequently. For example, the output frequency of the PLL changes at start-up and when changing channels. In each of these situations, it is desirable for the PLL to settle as quickly as possible on a desired output frequency. Further, in frequency hopping spread spectrum (FHSS) transceivers, the output frequency of the PLL changes for each frequency hop. Thus, the PLL is required to have an even faster settling time in order to comply with the timing requirements of the frequency hopping transceiver. One PLL system starts with a coarse tuning mode for rapid frequency tuning before switching to a fine tuning mode for stabilization and final settling. A controllable oscillator in the PLL system may use a tunable element with discrete steps, such as a selectable capacitor bank, for coarse tuning, and may use a continuously tunable element, such as one or more varactor diodes, for fine tuning.

In conventional PLLs there is a trade-off between settling time and phase noise, which are both a function of the gain, and the pole and zero locations in the PLL, which is well known to those skilled in the art of PLL design. The use of coarse tuning systems further adds to the start-up or settle time of the oscillator. Thus, a designer may be forced to select a bandwidth for the loop that meets the phase noise requirements while providing a less than desirable settling time, and vice versa. Thus, there remains a need for a frequency synthesizer that avoids the trade-off between settling time and phase noise, and that has a reduced settling time.

SUMMARY OF THE INVENTION

The present invention is a frequency and phase locked loop (FPLL) synthesizer having a frequency-locked loop (FLL) with an FLL operating mode and a phase-locked loop (PLL) with a PLL operating mode. The FLL operating mode is used for rapid coarse tuning of the FPLL synthesizer and is followed by the PLL operating mode for fine tuning and stabilization of the frequency of an output signal from the FPLL synthesizer. The FPLL synthesizer includes a variable frequency oscillator having a coarse tuning control input and a fine tuning control input. The coarse tuning control input is controlled by FLL circuitry, and the fine tuning input is controlled by PLL circuitry. The use of a frequency-locked loop allows faster settling time for the coarse tuning value than prior art linear and binary search methods. Additionally, the FPLL circuitry may include frequency reduction circuitry for reducing the frequency of the output signal for use in the FLL and PLL circuitry. The FLL circuitry may include frequency detection circuitry for measuring the frequency error of the frequency reduced output signal, and a loop filter to control the bandwidth of an FLL control loop formed by the FLL circuitry and the variable frequency oscillator. The FLL operating mode may be sub-divided into an FLL acquisition mode for rapid frequency tuning, and an FLL average and interpolate mode to complete frequency tuning before switching to the PLL operating mode. The PLL circuitry may include phase detection circuitry for measuring the phase error of the frequency reduced output signal and a loop filter to control the bandwidth of a PLL control loop formed by the PLL circuitry and the variable frequency oscillator.

Since the frequency reduction circuitry within the FLL circuitry reduces the frequency of the output signal, the gain and resolution of the FLL control loop may also be reduced, as in the case of using a frequency divider; therefore, the FLL control loop may include gain elements, such as analog gain elements, digital gain elements, or both, to recover some of the gain. To reduce tuning times, the gain of the FLL control loop may be higher during the FLL acquisition mode than during the FLL average and interpolate mode. Additionally, to reduce tuning times, a deliberate bias may be introduced into the FLL control loop to prevent the loop from getting stuck at a particular quantization level for an extended time period.

In one embodiment of the present invention, the FPLL synthesizer is a translational loop FPLL synthesizer, which may also be called an offset or dual loop FPLL that may use a local oscillator (LO) FPLL synthesizer to provide a reference signal to a primary FLL, primary PLL, or both. The LO FPLL synthesizer may have a coarse tuning mode and a fine tuning mode, and the primary FLL may begin coarse tuning before the LO FPLL synthesizer is completely settled, such as when the LO FPLL synthesizer switches from an FLL operating mode to a PLL operating mode, which may reduce frequency acquisition times when compared with binary-search algorithms, linear search algorithms, and other methods. There is a trade-off between settling time and phase noise, which are both a function of the gain, and the pole and zero locations in the FPLL synthesizer.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

Figure 1:
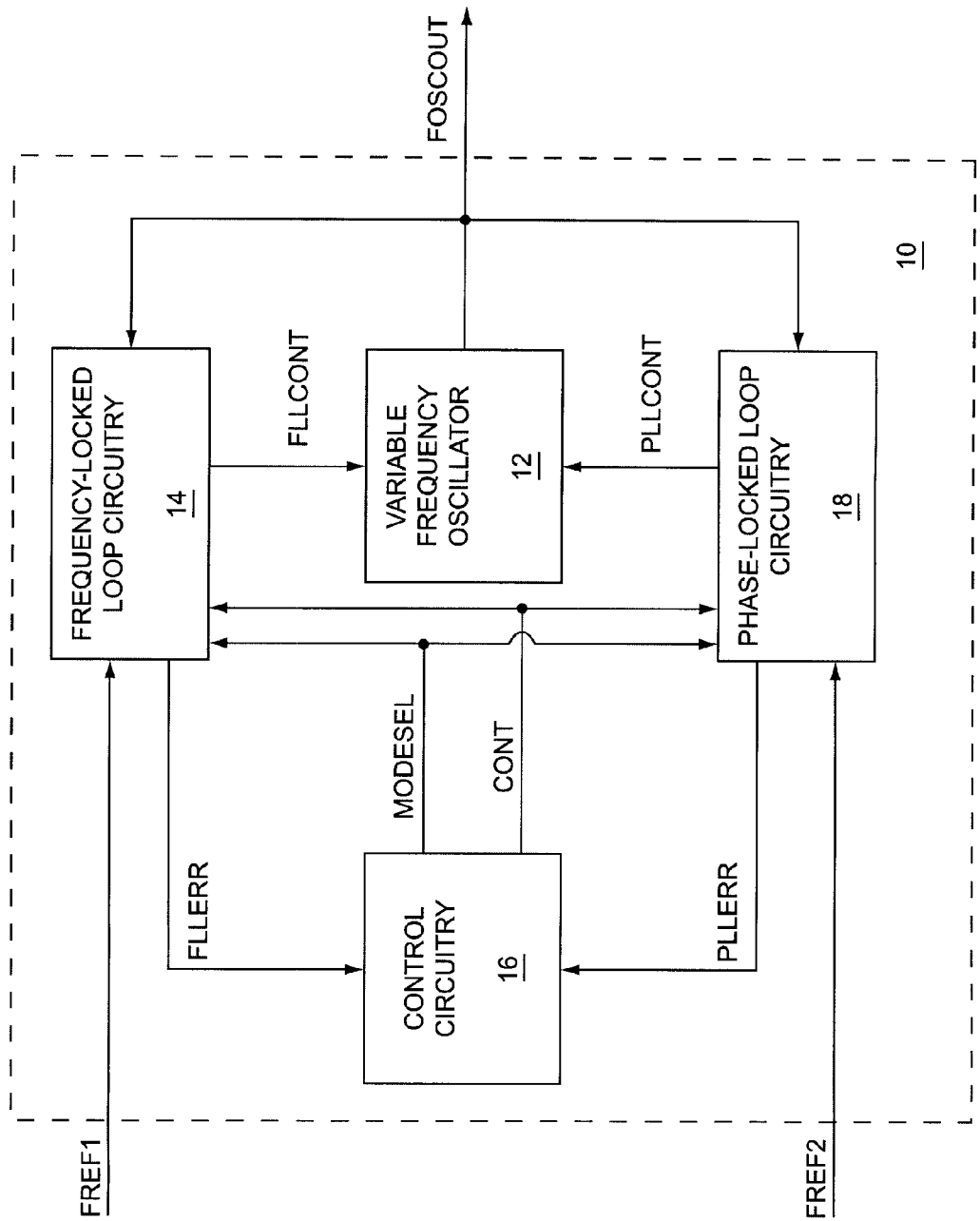
FIG. 1 shows a frequency and phase locked loop (FPLL) synthesizer, according to one embodiment of the present invention.

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention is a frequency and phase locked loop (FPLL) synthesizer having a frequency-locked loop (FLL) with an FLL operating mode and a phase-locked loop (PLL) with a PLL operating mode. The FLL operating mode is used for rapid coarse tuning of the FPLL synthesizer and is followed by the PLL operating mode for fine tuning and stabilization of the frequency of an output signal from the FPLL synthesizer. The FPLL synthesizer includes a variable frequency oscillator having a coarse tuning control input and a fine tuning control input. The coarse tuning control input is controlled by FLL circuitry, and the fine tuning input is controlled by PLL circuitry. The use of a frequency-locked loop allows faster settling time for the coarse tuning value than prior art linear and binary search methods. Additionally, the FPLL circuitry may include frequency reduction circuitry for reducing the frequency of the output signal for use in the FLL and PLL circuitry. The FLL circuitry may include frequency detection circuitry for measuring the frequency error of the frequency reduced output signal, and a loop filter to control the bandwidth of an FLL control loop formed by the FLL circuitry and the variable frequency oscillator. The FLL operating mode may be sub-divided into an FLL acquisition mode for rapid frequency tuning, and an FLL average and interpolate mode to complete frequency tuning before switching to the PLL operating mode. The PLL circuitry may include phase detection circuitry for measuring the phase error of the frequency reduced output signal and a loop filter to control the bandwidth of a PLL control loop formed by the PLL circuitry and the variable frequency oscillator.

Since the frequency reduction circuitry within the FLL circuitry reduces the frequency of the output signal, the gain and resolution of the FLL control loop may also be reduced, as in the case of using a frequency divider; therefore, the FLL control loop may include gain elements, such as analog gain elements, digital gain elements, or both, to recover some of the gain. To reduce tuning times, the gain of the FLL control loop may be higher during the FLL acquisition mode than during the FLL average and interpolate mode. Additionally, to reduce tuning times, a deliberate bias may be introduced into the FLL control loop to prevent the loop from getting stuck at a particular quantization level for an extended time period.

In one embodiment of the present invention, the FPLL synthesizer is a translational loop FPLL synthesizer, which may also be called an offset or dual loop FPLL that may use a local oscillator (LO) FPLL synthesizer to provide a reference signal to a primary FLL, primary PLL, or both. The LO FPLL synthesizer may have a coarse tuning mode and a fine tuning mode, and the primary FLL may begin coarse tuning before the LO FPLL synthesizer is completely settled, such as when the LO FPLL synthesizer switches from an FLL operating mode to a PLL operating mode to further reduce overall settling time of the FPLL synthesizer. There is a trade-off between settling time and phase noise, which are both a function of the gain, and the pole and zero locations in the FPLL synthesizer.

FIG. 1 shows an FPLL synthesizer 10, according to one embodiment of the present invention. The FPLL synthesizer 10 includes a variable frequency oscillator 12, which provides a first oscillator output signal FOSCOUT. Frequency-locked loop circuitry 14 receives the first oscillator output signal FOSCOUT and a first frequency reference signal FREF1, and provides an FLL error signal FLLERR to control circuitry 16 and an FLL control signal FLLCONT to the variable frequency oscillator 12. The FLL control signal FLLCONT is used for coarse tuning of the FPLL synthesizer 10. Both signals FLLERR, FLLCONT are based on a frequency error of the first oscillator output signal FOSCOUT relative to the first frequency reference signal FREF1.

Phase-locked loop circuitry 18 receives the first oscillator output signal FOSCOUT and a second frequency reference signal FREF2, and provides a PLL error signal PLLERR to the control circuitry 16 and a PLL control signal PLLCONT to the variable frequency oscillator 12. The PLL control signal PLLCONT is used for fine tuning the FPLL synthesizer 10. Both signals PLLERR, PLLCONT are based on a phase error of the first oscillator output signal FOSCOUT relative to the second frequency reference signal FREF2. In one embodiment of the present invention, the first and second frequency reference signals FREF1, FREF2 may be provided by a common frequency reference signal (not shown).

The control circuitry 16 provides a mode select signal MODESEL to the frequency-locked loop and phase-locked loop circuitry 14, 18. The mode select signal MODESEL selects either an FLL operating mode or a PLL operating mode. During the FLL operating mode, the frequency of the first oscillator output signal FOSCOUT is based on the FLL control signal FLLCONT and the PLL control signal PLLCONT is held constant, whereas during the PLL operating mode, the frequency of the first oscillator output signal FOSCOUT is based on the PLL control signal PLLCONT and FLL control signal FLLCONT is held constant. The control circuitry 16 may switch the mode select signal MODESEL from the FLL operating mode to the PLL operating mode based on the FLL error signal FLLERR. Alternatively, the control circuitry 16 may switch operating modes based on a time duration of the FLL operating mode. The control circuitry 16 may also provide a control signal CONT to the frequency-locked loop and phase-locked loop circuitry 14, 18 for configuration selection, control, or any needed information that is not provided by the mode select signal MODESEL, such as initial set-up of the FPLL synthesizer 10.

Generally, coarse tuning is done using the FLL operating mode, which is then switched to the PLL operating mode for fine tuning. The switch to the PLL operating mode can be made when the FLL has settled within its resolution, or when the frequency error is low enough to provide a reasonable lock time in the PLL operating mode. The switch can be triggered by a frequency error measurement in the frequency-locked loop circuitry 14 or by a simple timer, such as a counter, programmed with a value predetermined to provide adequate settle time for the FLL, or by a combination of both. Alternate embodiments of the present invention may use any combination of the FLL and PLL error signals FLLERR, PLLERR, the FLL and PLL control signals FLLCONT, PLLCONT, the first and second reference signals FREF1, FREF2, and the first oscillator output signal FOSCOUT to determine mode selection. Each of the FLL and PLL control signals FLLCONT, PLLCONT may include digital data, analog data, or both; therefore, the variable frequency oscillator 12 may include a digital controlled oscillator (DCO), a voltage controlled oscillator (VCO), a current controlled oscillator (ICO), or any combination thereof. The variable frequency oscillator 12 may also include selectable capacitor banks, varactor diodes, variable current sources, or other devices to change the frequency of the first oscillator output signal FOSCOUT. The frequency-locked loop circuitry 14, the control circuitry 16, and the phase-locked loop circuitry 18 may include analog circuitry, digital circuitry, one or more software programs executing on computer hardware, such as a microprocessor, digital signal processor, or the like, or any combination thereof.

Figure 2:
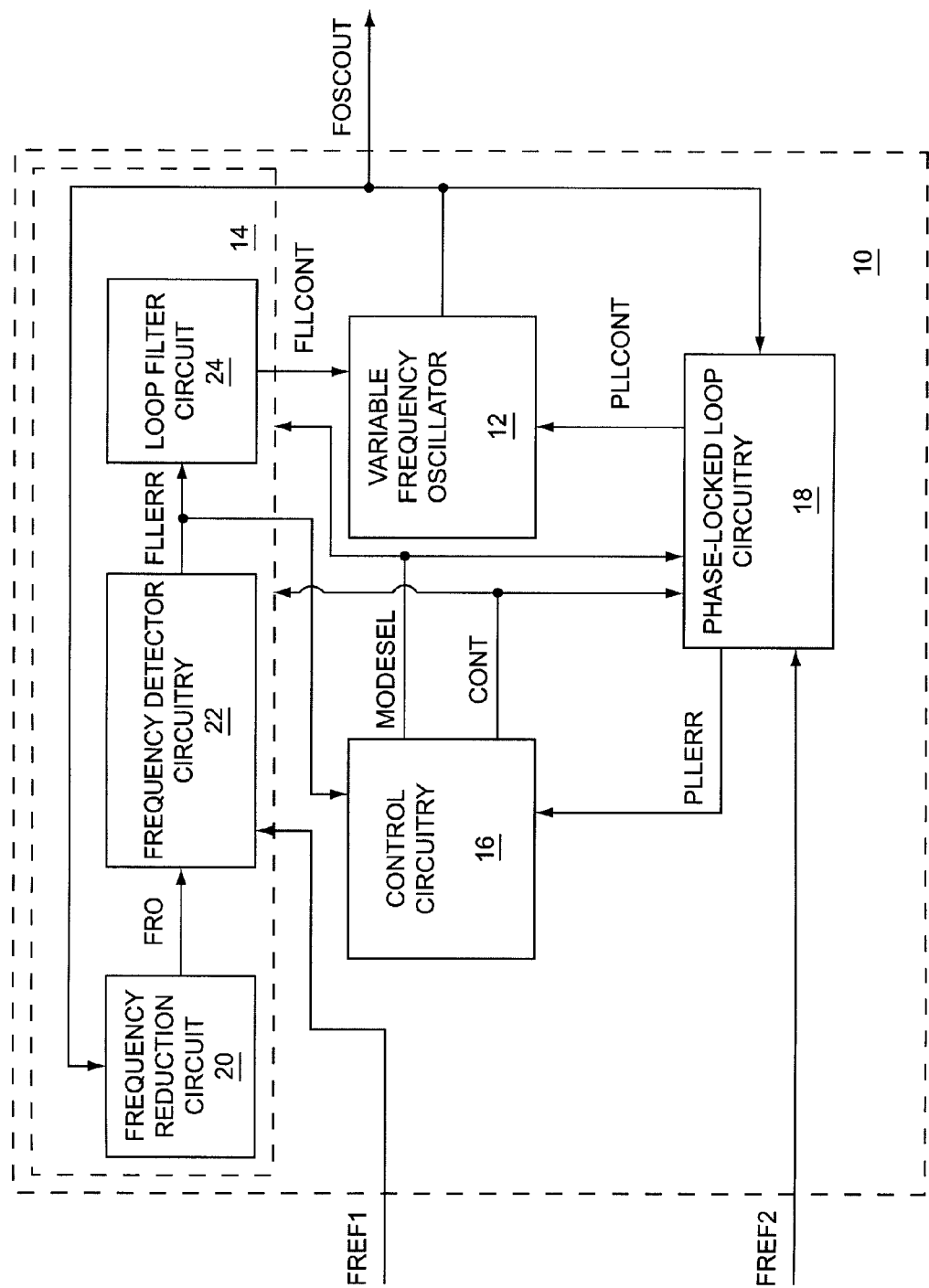
FIG. 2 shows details of the frequency-locked loop (FLL) circuitry illustrated in FIG. 1.

FIG. 2 shows details of the frequency-locked loop circuitry 14 illustrated in FIG. 1. The first oscillator output signal FOSCOUT feeds a frequency reduction circuit 20, which produces a frequency reduced output signal FRO based on the first oscillator output signal FOSCOUT, such that the frequency of the frequency reduced output signal FRO is normally less than the frequency of the first oscillator output signal FOSCOUT. Frequency detector circuitry 22 receives the frequency reduced output signal FRO and the first frequency reference signal FREF1, and provides the FLL error signal FLLERR to the control circuitry 16 and to a loop filter circuit 24. The FLL error signal FLLERR may be based on a frequency difference between the frequency reduced output signal FRO and the first frequency reference signal FREF1. The loop filter circuit 24 includes a filter, such as a lowpass filter or an integrator, and filters the FLL error signal FLLERR to provide the FLL control signal FLLCONT. Those skilled in the art will recognize that the frequency-locked loop circuitry 14 forms a negative-feedback control system, which automatically determines a value for the FLL control signal FLLCONT that minimizes the average value of the FLL error signal FLLERR. In an alternate embodiment of the present invention, the frequency reduction circuit 20 may be part of the frequency-locked loop circuitry 14, part of the phase-locked loop circuitry 18, or the frequency-locked and phase-locked loop circuitry 14, 18 may each have frequency reduction circuitry.

Figure 3:
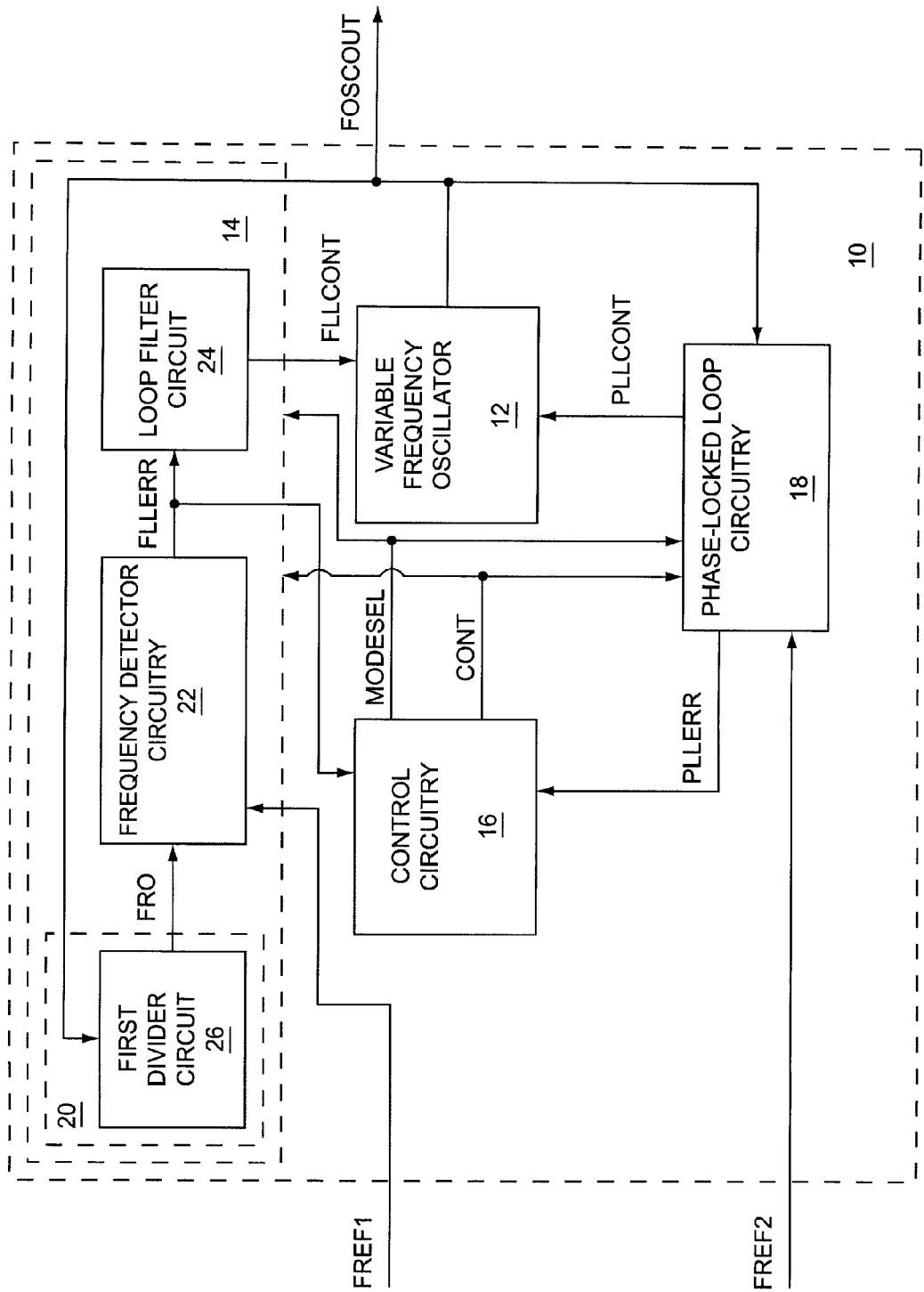
FIG. 3 shows one embodiment of the frequency reduction circuit illustrated in FIG. 2.

FIG. 3 shows one embodiment of the frequency reduction circuit 20 illustrated in FIG. 2. The frequency reduction circuit 20 may include a first divider circuit 26, such that the frequency of the first oscillator output signal FOSCOUT divided by the frequency of the frequency reduced output signal FRO is approximately equal to a first integer divided by a second integer. The use of a frequency reduction circuit 20 may be advantageous in situations where the frequency of the first oscillator output signal FOSCOUT is significantly higher than the frequency of the first frequency reference signal FREF1; however, in an alternate embodiment of the present invention, the frequency of the first oscillator output signal FOSCOUT may be lower than the frequency of the first frequency reference signal FREF1.

In an additional embodiment of the present invention, the FPLL synthesizer 10 and frequency locked loop circuitry 14 may be implemented without a frequency reduction circuit 20. This may be advantageous in situations where the frequency of the first oscillator output signal FOSCOUT is not greatly different than the frequency of the first frequency reference signal FREF1. Examples of this situation include the use of a synthesizer to reduce jitter or to correct frequency errors in a clock signal generated from a noisy source or an inaccurately tuned source, respectively.

Figure 4:
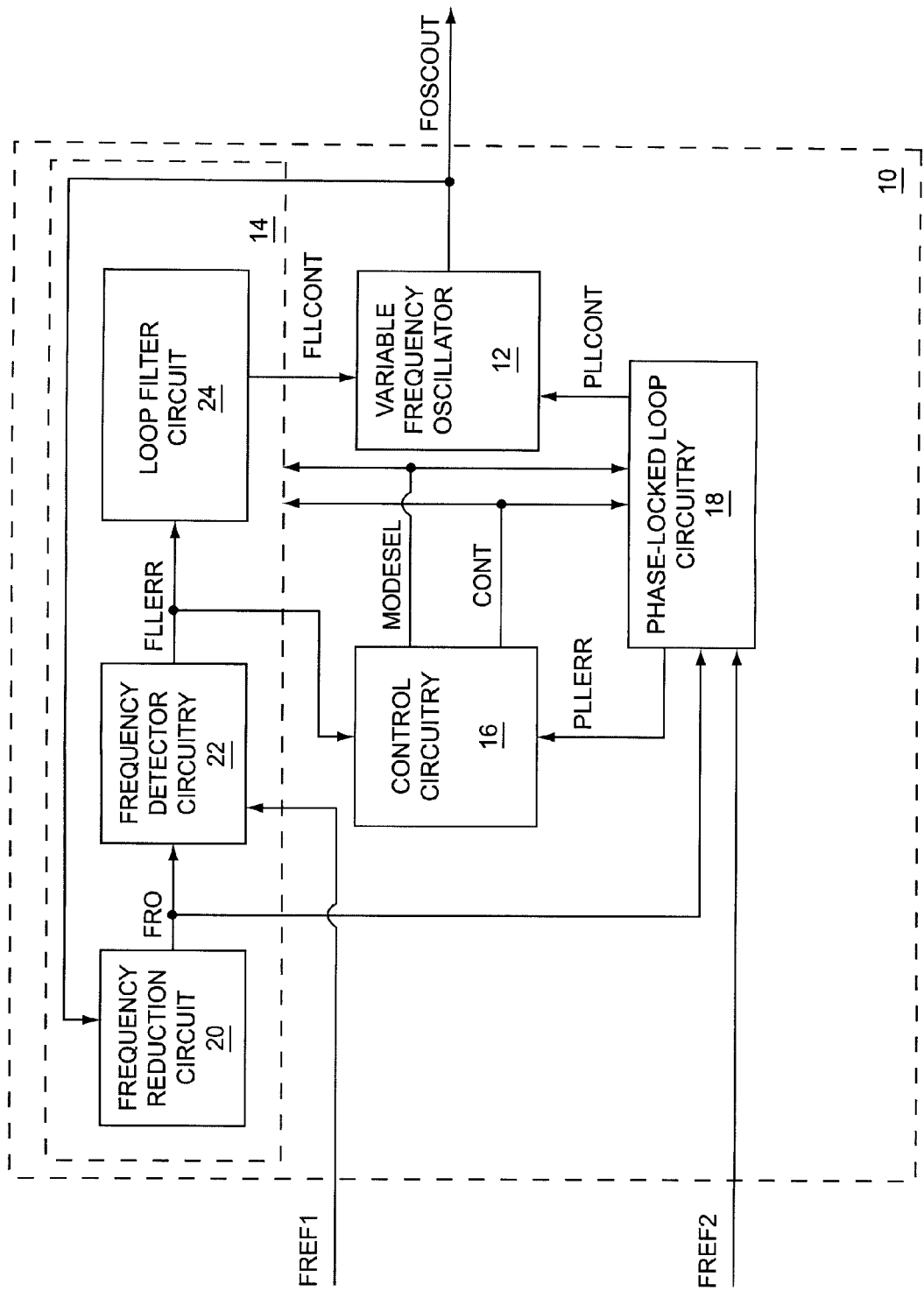
FIG. 4 shows an alternate embodiment of the FPLL synthesizer.

FIG. 4 shows an alternate embodiment of the FPLL synthesizer 10. The phase-locked loop circuitry 18 may share some of the frequency-locked loop circuitry 14, such as the frequency reduction circuit 20. The phase-locked loop circuitry 18 may receive the frequency reduced output signal FRO instead of the first oscillator output signal FOSCOUT, such that the PLL error signal PLLERR is based on a phase difference between the frequency reduced output signal FRO and the second frequency reference signal FREF2.

Figure 5:
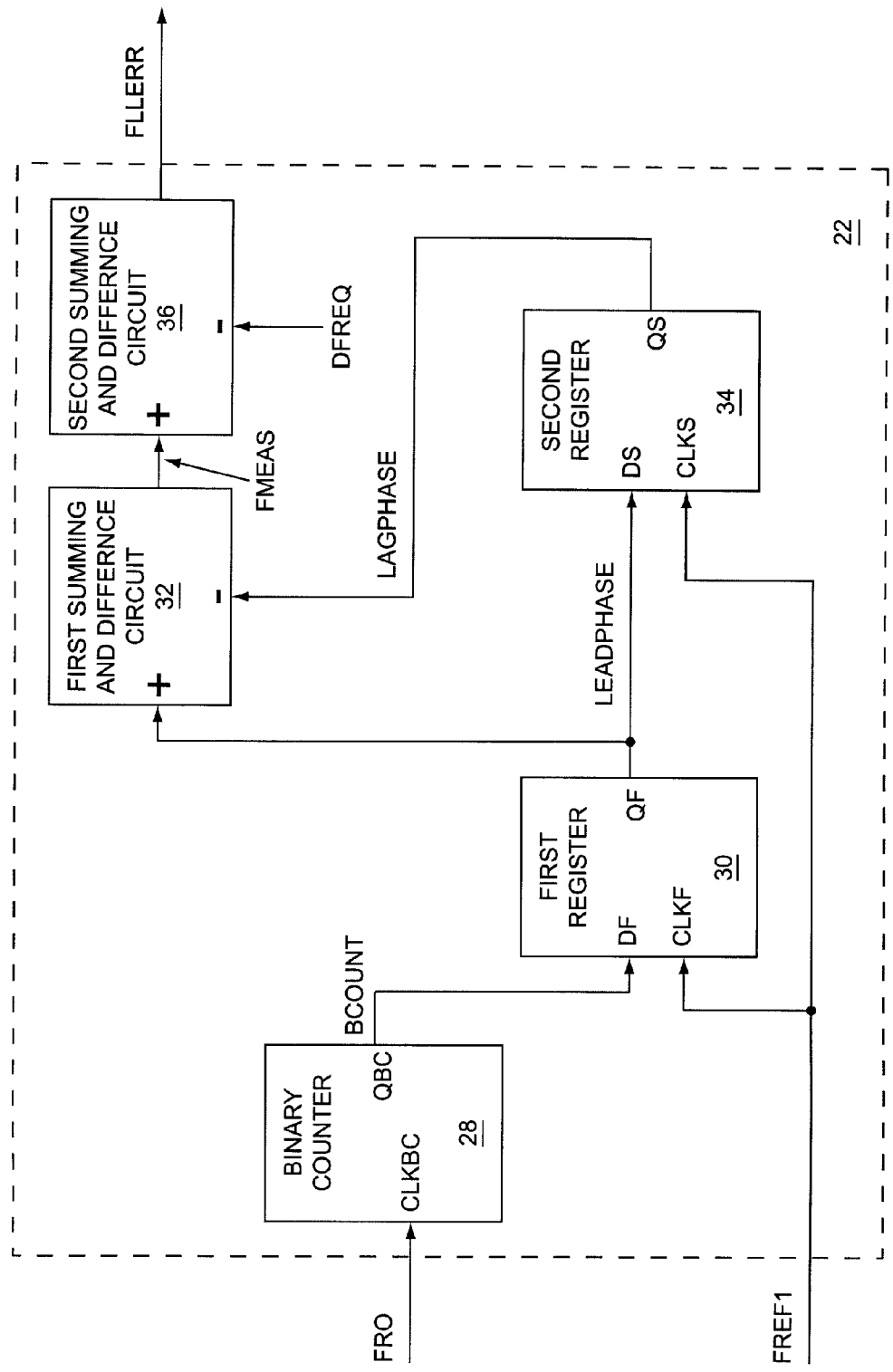
FIG. 5 shows details of the frequency detector circuitry illustrated in FIG. 2.

FIG. 5 shows details of the frequency detector circuitry 22 illustrated in FIG. 2. The frequency detector circuitry 22 provides the FLL error signal FLLERR by measuring the frequency of the frequency reduced output signal FRO and subtracting out a desired frequency, which is provided by a desired frequency value DFREQ. The frequency may be measured by counting the number of cycles of the frequency reduced output signal FRO that occur during a specified time period, which may be at least one period of the first frequency reference signal FREF1. In one embodiment of the present invention, the desired frequency may be approximately equal to the frequency of the first frequency reference signal FREF1, such that the desired frequency value DFREQ, representing the number of cycles of the frequency reduced output signal FRO that occur during one period of the first frequency reference signal FREF1, is approximately one. In an alternate embodiment of the frequency detector circuitry 22, the frequency may be measured by counting the number of cycles of the first oscillator output signal FOSCOUT that occur during a specified time period, which may be at least one period of the first frequency reference signal FREF1. In an additional embodiment of the present invention, the frequency detector circuit 22 provides only a fixed positive or fixed negative value for the FLL error signal FLLERR if the frequency reduced output signal FRO has a shorter or longer period than the first frequency reference signal FREF1, respectively, thereby providing a "bang-bang" type of control algorithm for the FLL. In an exemplary embodiment of the present invention, the value of the FLL error signal FLLERR is approximately proportional to the frequency error measured by the frequency detector circuitry 22 giving a better behaved proportional, proportional-integral, or proportional-integral-differential control algorithm for the FLL, depending on the implementation of the loop filter circuit 24.

The frequency detector circuitry 22 includes a binary counter 28 having a binary counter clock input CLKBC, which receives the frequency reduced output signal FRO, and a binary counter data output QBC, which provides a binary count output signal BCOUNT. Each cycle of the frequency reduced output signal FRO may increment the binary counter 28. The value of the binary counter 28 is provided from the binary counter data output QBC, which may include multiple data bits. The binary count output signal BCOUNT feeds a first data input DF of a first register 30, which includes a first data output QF and a first clock input CLKF. The first frequency reference signal FREF1 feeds the first clock input CLKF. On an edge of the first frequency reference signal FREF1, the value of the binary counter 28 is clocked into the first register 30, and then appears at the first data output QF, which provides a leading count signal LEADPHASE. It will be appreciated by those skilled in the art that additional embodiments may replace the binary counter 28 with a Gray code counter or other digital sequence generating circuit with a decoding circuit to provide an equivalent measure of the elapsed count.

The leading count signal LEADPHASE feeds a first summing input of a first summing and difference circuit 32 and a second data input DS of a second register 34, which includes a second data output QS and a second clock input CLKS. The first frequency reference signal FREF1 feeds the second clock input CLKS. On a subsequent edge of the first frequency reference signal FREF1, the value of the binary counter 28 that was previously clocked into the first register 30 is clocked into the second register 34, and then appears at the second data output QS, which provides a lagging count signal LAGPHASE. The lagging count signal LAGPHASE feeds a first difference input of the first summing and difference circuit 32, which provides an output signal based on a difference between a signal at the first summing input and a signal at the first difference input.

At any time after an edge of the first frequency reference signal FREF1, such that the first and second data outputs QF, QS have had time to stabilize, the difference between the leading count signal LEADPHASE and the lagging count signal LAGPHASE is approximately equal to the number of cycles of the frequency reduced output signal FRO counted between the two edges of the first frequency reference signal FREF1. The number of cycles counted is proportional to the frequency of the frequency reduced output signal FRO; therefore, the output signal, called the measured frequency signal FMEAS, from the first summing and difference circuit 32 is proportional to the frequency of the frequency reduced output signal FRO. The measured frequency signal FMEAS feeds a second summing input of a second summing and difference circuit 36. The desired frequency signal DFREQ feeds a second difference input of the second summing and difference circuit 36, which provides the FLL error signal FLLERR based on a difference between the measured frequency signal FMEAS and the desired frequency signal DFREQ.

Since the frequency reduced output signal FRO is typically not synchronized with the first frequency reference signal FREF1, one or more bits in the binary count output signal BCOUNT may be changing when clocked into the first register 30; therefore, an erroneous value of the binary counter 28 may be clocked into the first register 30. If the binary counter 28 was changing from a value with multiple "1s" to a value with multiple "0s," such as 0111 to 1000, the clocked value of the binary counter 28 could be in error by multiple bits.

Figure 6:
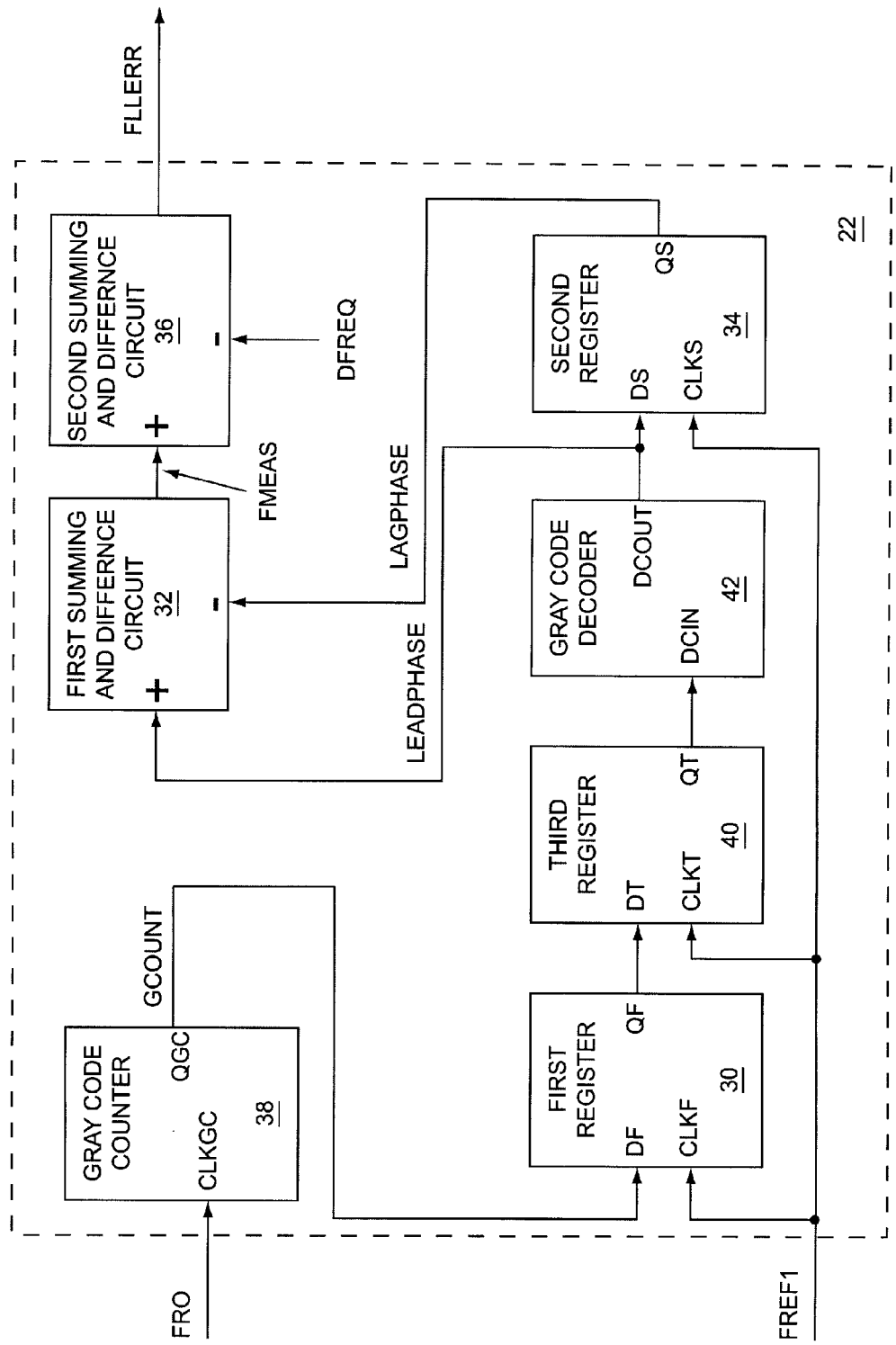
FIG. 6 shows an alternate embodiment of the frequency detector circuitry.

FIG. 6 shows an alternate embodiment of the frequency detector circuitry 22. The binary counter 28 is replaced with a Gray code counter 38, which has a Gray counter clock input CLKGC that receives the frequency reduced output signal FRO, and a Gray code counter data output QGC, which provides a Gray code count output signal GCOUNT. Each cycle of the frequency reduced output signal FRO may increment the Gray code counter 38. The value of the Gray code counter 38 is provided from the Gray code counter data output QGC, which may include multiple data bits. The Gray code counter 38 is a binary counter that provides a Gray code output, which changes only one bit for each incremental value of the binary counter 28; therefore, any count errors introduced due to asynchronous clocking of registers receiving the Gray code count output signal GCOUNT will result in a maximum count error of one bit. The Gray code count output signal GCOUNT feeds the first data input DF of the first register 30.

The first data output QF feeds a third data input DT of a third register 40, which includes a third data output QT and a third clock input CLKT. The first frequency reference signal FREF1 feeds the third clock input CLKT. On a subsequent edge of the first frequency reference signal FREF1, the value of the Gray code counter 38 that was previously clocked into the first register 30 is clocked into the third register 40, and then appears at the third data output QT. The third data output QT feeds a decoder input DCIN of a Gray code decoder 42, which converts a Gray code signal into a binary signal provided from a decoder output DCOUT, which provides the leading count signal LEADPHASE. Additional embodiments of the present invention may include fewer or more flip-flops, coding systems other than a Gray code, at least one divider in series with the first frequency reference signal FREF1, at least one divider in series with the frequency reduced output signal FRO, different frequency measuring systems, different frequency error measuring systems, or any combination thereof. A coding system may be used other than a Gray code system that still provides a single-bit change in its output value for each clocking event.

Figure 7:
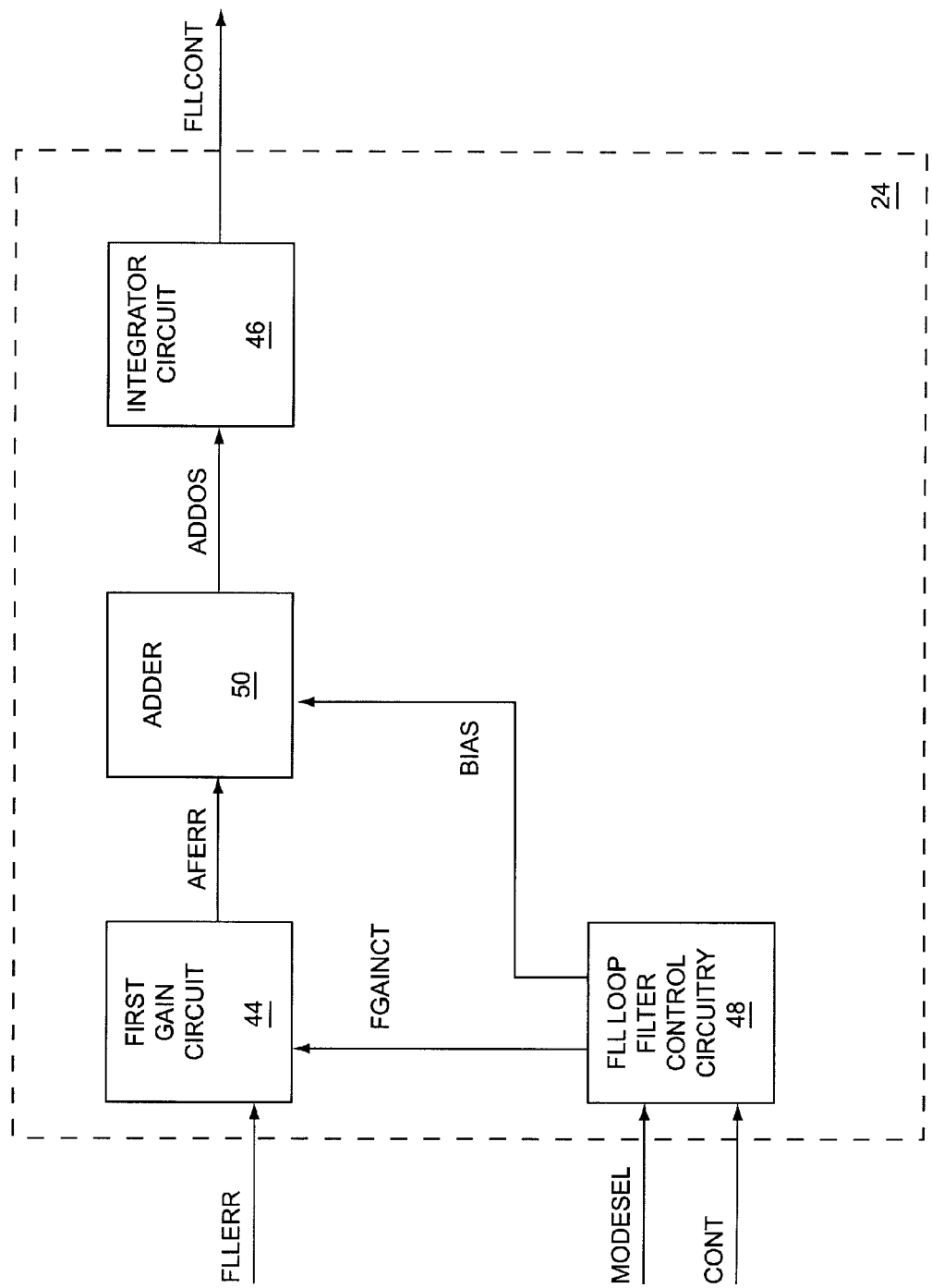
FIG. 7 shows details of the loop filter circuit illustrated in FIG. 2.

FIG. 7 shows details of the loop filter circuit 24 illustrated in FIG. 2. The loop filter circuit 24 includes a first gain circuit 44, an integrator circuit 46, FLL loop filter control circuitry 48, and an adder 50. The first gain circuit 44 receives and amplifies the FLL error signal FLLERR to provide an amplified FLL error signal AFERR to the adder 50, which may add an offset, or "push," signal based on a bias signal BIAS to create an adder output signal ADDOS. The integrator circuit 46 receives and filters the adder output signal ADDOS using integration to provide the FLL control signal FLLCONT.

In one embodiment of the present invention, the FLL loop filter control circuitry 48 receives the control signal CONT and the mode select signal MODESEL, and may provide the bias signal BIAS. Since the FLL error signal FLLERR is based on a frequency difference between the frequency reduced output signal FRO and the first frequency reference signal FREF1, as the frequency of the frequency reduced output signal FRO approaches the frequency of the first frequency reference signal FREF1, the FLL error signal FLLERR approaches zero; therefore, due to the quantization of values in a digital implementation, the represented value of the FLL error signal FLLERR could be zero and an undesirable amount of time may have to pass before the FLL control signal FLLCONT changes significantly. The bias signal BIAS adds a "push" to the integrator input so that the FLL control signal FLLCONT keeps changing, which reduces the time needed to identify when to switch operating modes. The bias, or "push," that is added to the integrator input may be subtracted out so that the first oscillator output signal FOSCOUT is tuned to the correct frequency. Any or all of the first gain circuit 44, the integrator circuit 46, the FLL loop filter control circuitry 48, and the adder 50 may be provided by digital circuitry, one or more software programs executing on computer hardware, such as a microprocessor, digital signal processor, both, or the like. The bias signal BIAS may cause the adder 50 to periodically add or subtract a single count to the amplified FLL error signal AFERR.

The FLL loop filter control circuitry 48 may provide a first gain control signal FGAINCT to the first gain circuit 44 to control the gain of the FLL loop, called FLL loop gain. Since reducing the frequency of the first oscillator output signal FOSCOUT reduces the gain and bandwidth of the FLL loop, recovering some of the FLL loop gain may be beneficial for certain operating modes; therefore, the FLL loop filter control circuitry 48 may increase or decrease the FLL loop gain, as needed. In one embodiment of the present invention, the FLL operating mode is sub-divided into an FLL acquisition mode for rapid frequency tuning, and an FLL average and interpolate mode to complete frequency tuning before switching to the PLL operating mode. Coarse tuning begins with the FLL acquisition mode, such that the FLL error signal FLLERR remains either positive or negative. When the FLL error signal FLLERR starts toggling between positive and negative, the FLL acquisition mode switches to the FLL average and interpolate mode. The duty-cycle of the positive, or negative, FLL error signal FLLERR is determined by the FLL loop filter control circuitry 48, then the appropriate first gain control signal FGAINCT and bias signal BIAS are created. During the FLL acquisition mode, the FLL loop gain may be increased for rapid frequency tuning.

In an exemplary embodiment of the present invention, the variable frequency oscillator 12 is a digitally controlled oscillator having a capacitor bank with 128 different selectable capacitance values; therefore, the FLL control signal FLLCONT is a digital signal having 128 different values. The frequency reduction circuit 20 includes the first divider circuit 26, which reduces the FLL loop gain such that some gain needs to be restored. For each single value change of the FLL error signal FLLERR, the amplified FLL error signal AFERR changes by eight times the single value change, which increases the FLL loop gain by a factor of eight. For example, if the FLL error signal FLLERR changes by a single increment of a binary count, then the amplified FLL error signal AFERR changes by eight increments of the binary count. In alternate embodiments, either or both of the first gain circuit 44 and the adder 50 may be omitted. Other embodiments may use other filter circuits instead of the integrator circuit 46. Regardless of the gain applied by the first gain circuit 44, the adder 50 would normally "push" by a single bit at a time.

Figure 8:
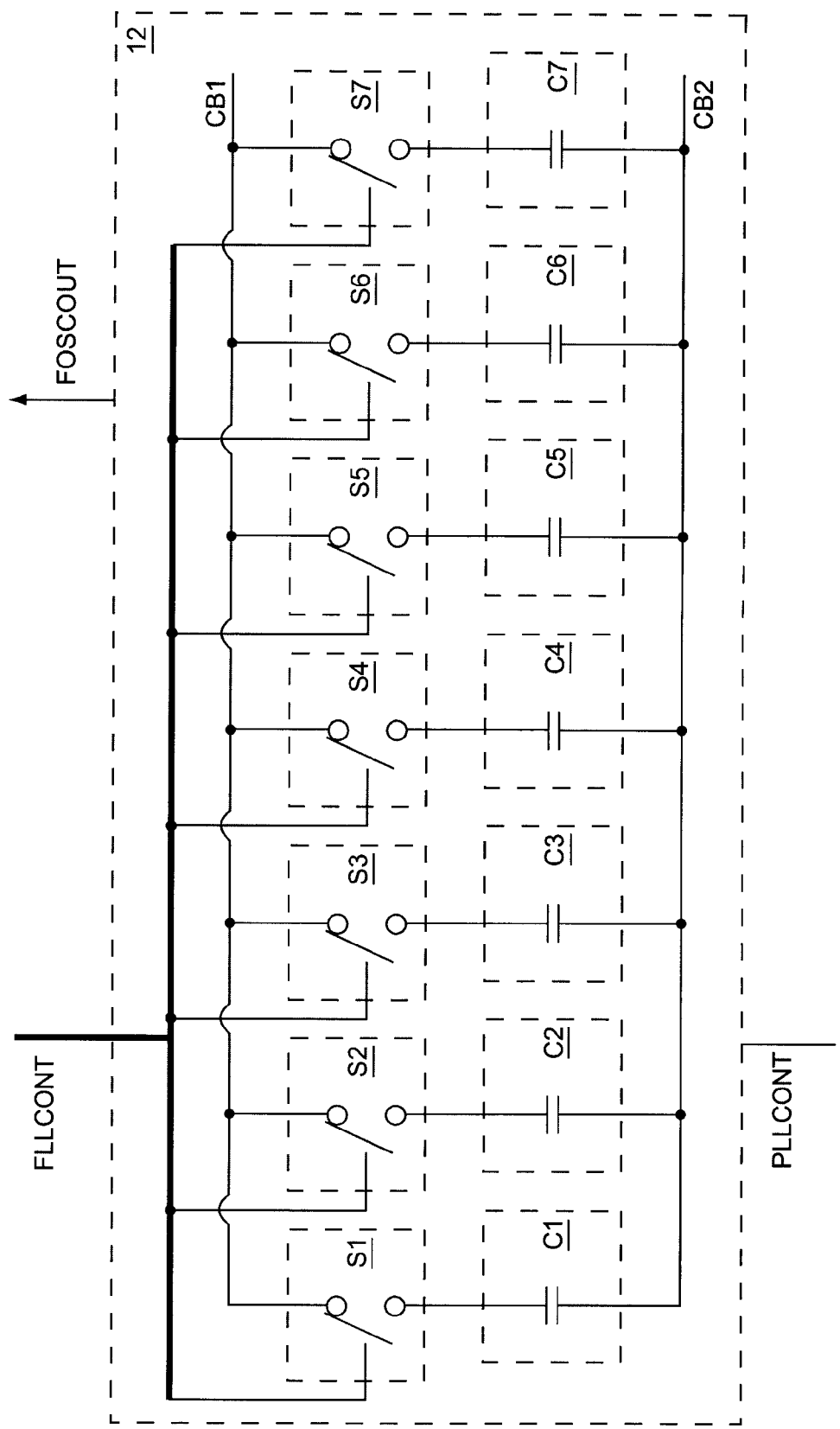
FIG. 8 shows one embodiment of the variable frequency oscillator illustrated in FIG. 1.

FIG. 8 shows one embodiment of the variable frequency oscillator 12 illustrated in FIG. 1. The variable frequency oscillator 12 may include a digitally controlled oscillator having a capacitor bank with seven selectable capacitive elements that provide 128 different selectable capacitance values for coarse tuning; therefore, the FLL control signal FLLCONT may include a seven-bit digital signal having 128 different values. A resonant frequency of the variable frequency oscillator 12 may be based on a capacitance of the capacitor bank. The capacitor bank includes a first capacitive element C1 coupled in series with a first switching element S1. The first elements C1, S1 are coupled between a first capacitor bank node CB1 and a second capacitor bank node CB2. A first bit of the FLL control signal FLLCONT controls the first switching element S1. Similarly, a second capacitive element C2 is coupled in series with a second switching element S2, a third capacitive element C3 is coupled in series with a third switching element S3, a fourth capacitive element C4 is coupled in series with a fourth switching element S4, a fifth capacitive element C5 is coupled in series with a fifth switching element S5, a sixth capacitive element C6 is coupled in series with a sixth switching element S6, and a seventh capacitive element C7 is coupled in series with a seventh switching element S7. The series coupled elements C1, S1, C2, S2, C3, S3, C4, S4, C5, S5, C6, S6, C7, S7 are coupled between the first capacitor bank node CB1 and the second capacitor bank node CB2. Second, third, fourth, fifth, sixth, and seventh bits of the FLL control signal FLLCONT control the second, third, fourth, fifth, sixth, and seventh switching elements S2, S3, S4, S5, S6, S7, respectively.

A capacitance of the second capacitive element C2 may be approximately two times a capacitance of the first capacitive element C1. A capacitance of the third capacitive element C3 may be approximately two times a capacitance of the second capacitive element C2. A capacitance of the fourth capacitive element C4 may be approximately two times a capacitance of the third capacitive element C3. A capacitance of the fifth capacitive element C5 may be approximately two times a capacitance of the fourth capacitive element C4. A capacitance of the sixth capacitive element C6 may be approximately two times a capacitance of the fifth capacitive element C5. A capacitance of the seventh capacitive element C7 may be approximately two times a capacitance of the sixth capacitive element C6.

Alternate embodiments of the present invention may use a capacitor bank having more or fewer than seven capacitive elements, capacitive elements having a binary weighting, as described above, capacitive elements having a non-binary weighting, capacitive elements having a constant incrementing, or thermometer style, weighting, or any combination thereof. Alternate embodiments of the present invention may use discrete capacitive tuning elements, as described above, discrete non-capacitive tuning elements, or both, for coarse tuning.

Figure 9:
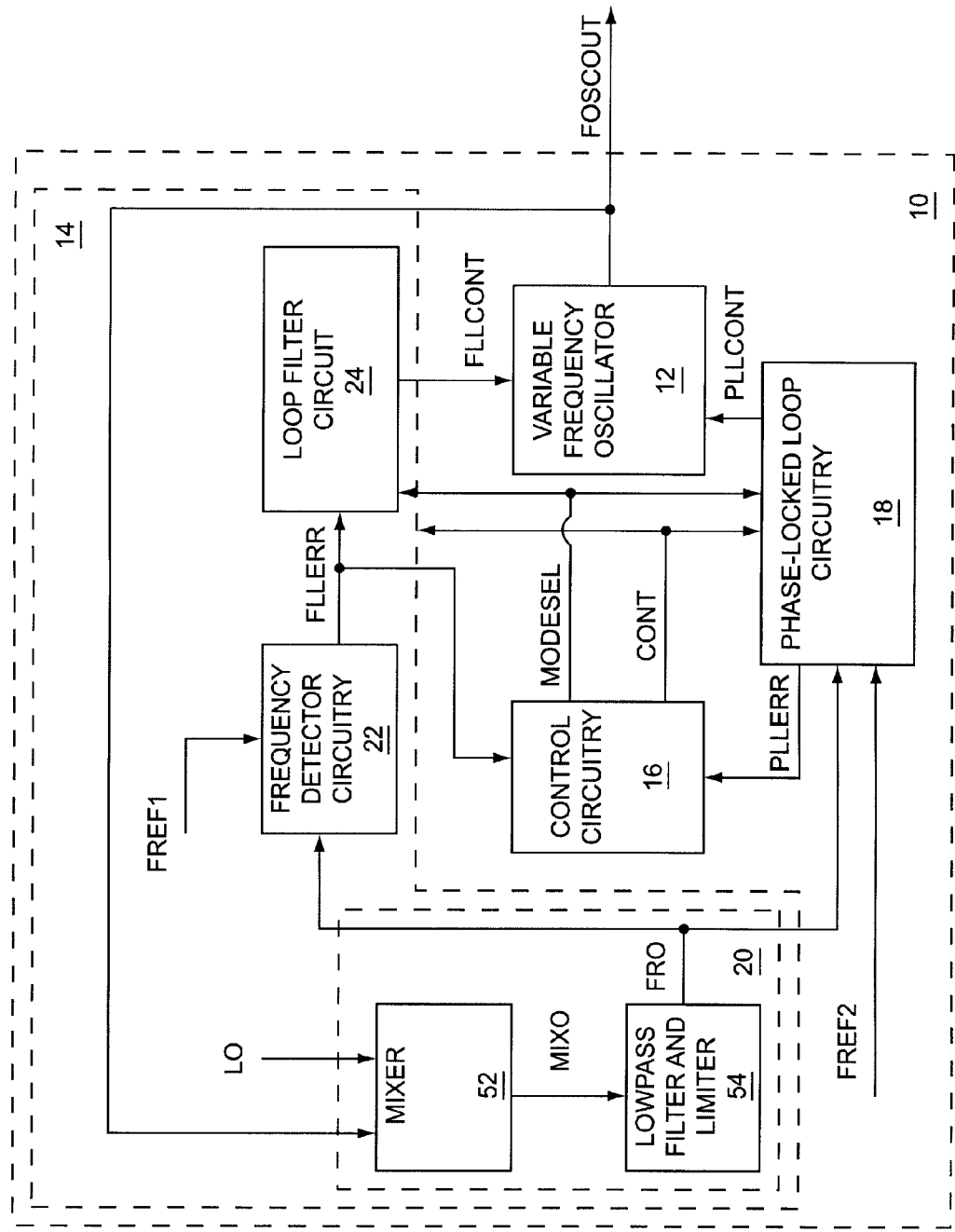
FIG. 9 shows an alternate embodiment of the frequency reduction circuit illustrated in FIG. 2.

FIG. 9 shows an alternate embodiment of the frequency reduction circuit 20 illustrated in FIG. 2. Instead of using a divider to reduce the frequency of the first oscillator output signal FOSCOUT as illustrated in the embodiment of FIG. 3, an RF mixer 52 is used to reduce the frequency of the first oscillator output signal FOSCOUT by down-conversion. The frequency reduction circuit 20 may include the RF mixer 52 and a lowpass filter and limiter 54. The RF mixer 52 mixes the first oscillator output signal FOSCOUT with a local oscillator signal LO to provide a down-converted mixer output signal MIXO, which is fed into the lowpass filter and limiter 54. The lowpass filter and limiter 54 filters and limits the down-converted mixer output signal MIXO to provide the frequency reduced output signal FRO. Use of a mixer for frequency reduction has an advantage over use of a frequency divider. Unlike a frequency divider, which divides the phase and frequency of the input signal to generate the output signal, phase and frequency differences between the signals present at the RF and LO input ports of a mixer are translated to phase and frequency errors in the mixer output signal without reduction in magnitude. Hence the mixer does not reduce the gains of the FLL and PLL.

A control anomaly may be present when using the RF mixer 52 in the FLL control loop as shown in the following example. The frequency of the first oscillator output signal FOSCOUT is called a first oscillator output frequency $RF_{OUT}$. A desired frequency of the first oscillator output signal FOSCOUT is called a desired first oscillator output frequency $RF_{DES}$. In this example, $RF_{DES}$ is lower in frequency than the local oscillator frequency $RF_{LO}$, known in the art as high-side injection. In this example, a value of the FLL error signal FLLERR, called an FLL error value $V_{ERR}$, is zero when a frequency of the frequency reduced output signal FRO, called a frequency reduced output frequency $IF_{OUT}$ is approximately equal to a frequency of the first frequency reference signal FREF1, called a first reference frequency $IF_{REF}$. When $IF_{OUT}$ is approximately equal to $IF_{REF}$, then $IF_{OUT}$ is equal to a desired intermediate frequency $IF_{DES}$, and $RF_{OUT}$ is equal to $RF_{DES}$. The frequency of the local oscillator signal LO is called a local oscillator frequency $RF_{LO}$. The RF mixer 52 produces the mixer output signal MIXO having an up-conversion frequency $RF_{MIXOU}$ produced from a sum of its input signals as shown in EQ. 1, and a down-conversion frequency $IF_{MIXOD}$ produced from a difference of its input signals as shown in EQ. 2.

$$RF_{MIXOU} = RF_{LO} + RF_{OUT}. \qquad \text{EQ. 1}$$

$$IF_{MIXOD} = RF_{LO} - RF_{OUT}. \qquad \text{EQ. 2}$$

In this example, the lowpass filter and limiter 54 removes the up-conversion frequency $RF_{MIXOU}$; therefore, only the down-conversion frequency $IF_{MIXOD}$ makes it through to the frequency reduced output signal FRO, as shown in EQ. 3.

$$IF_{OUT} = IF_{MIXOD} = RF_{LO} - RF_{OUT}. \qquad \text{EQ. 3}$$

Since $RF_{OUT}$ is equal to $RF_{DES}$ when $IF_{OUT}$ is equal to $IF_{DES}$, then EQ. 4 is obtained by substitution into EQ. 3, and the FLL error value $V_{ERR}$ is given by EQ. 5. It is clear from EQ. 5 that the FLL error value $V_{ERR}$ is approximately zero when the first oscillator output frequency $RF_{OUT}$ is approximately equal to the desired first oscillator output frequency $RF_{DES}$.

$$IF_{DES} = RF_{LO} - RF_{DES}. \qquad \text{EQ. 4}$$

$$V_{ERR} = IF_{OUT} - IF_{DES} = RF_{DES} - RF_{OUT}. \qquad \text{EQ. 5}$$

Since the frequency detector circuitry 22 measures frequency errors independent of phase differences, only the absolute values of $IF_{OUT}$ and $RF_{DES}$ influence $V_{ERR}$. The behavior of the variable frequency oscillator 12 in response to $IF_{OUT}$ and $V_{ERR}$ is described by EQ. 6, EQ. 7, EQ. 8, and EQ. 9.

$$\text{If } |IF_{OUT}| < |IF_{DES}|, \text{ then } V_{ERR} = \text{positive}. \qquad \text{EQ. 6}$$

$$\text{If } V_{ERR} = \text{positive, then } RF_{OUT} \text{ is driven down}. \qquad \text{EQ. 7}$$

$$\text{If } |IF_{OUT}| > |IF_{DES}|, \text{ then } V_{ERR} = \text{negative}. \qquad \text{EQ. 8}$$

$$\text{If } V_{ERR} = \text{negative, then } RF_{OUT} \text{ is driven up}. \qquad \text{EQ. 9}$$

By examination of EQ. 3, if $RF_{OUT} < RF_{DES}$, then $IF_{OUT} > IF_{DES}$, which produces a negative FLL error signal FLLERR that drives $RF_{OUT}$ up, which is the correct response as illustrated in EQ. 10, EQ. 11, and EQ. 12.

$$\text{If } RF_{OUT} < RF_{DES}, \text{ then } IF_{OUT} > IF_{DES}. \qquad \text{EQ. 10}$$

$$\text{If } |IF_{OUT}| > |IF_{DES}|, \text{ then } V_{ERR} = \text{negative}. \qquad \text{EQ. 11}$$

$$\text{If } V_{ERR} = \text{negative, then } RF_{OUT} \text{ is driven up}. \qquad \text{EQ. 12}$$

Additionally, by examination of EQ. 3, if $RF_{OUT} > RF_{DES}$ and $RF_{OUT} < RF_{LO}$, then $IF_{OUT}$ is positive and $IF_{OUT} < IF_{DES}$, which produces a positive FLL error signal FLLERR that drives $RF_{OUT}$ down, which is the correct response as illustrated in EQ. 13, EQ. 14, and EQ. 15.

$$\text{If } RF_{OUT} > RF_{DES}, \text{ then } IF_{OUT} < IF_{DES}. \qquad \text{EQ. 13}$$

$$\text{If } |IF_{OUT}| < |IF_{DES}|, \text{ then } V_{ERR} = \text{positive}. \qquad \text{EQ. 14}$$

$$\text{If } V_{ERR} = \text{positive, then } RF_{OUT} \text{ is driven down}. \qquad \text{EQ. 15}$$

Further, by examination of EQ. 3, if $RF_{OUT} > RF_{DES}$ and $RF_{OUT} > RF_{LO}$, then $IF_{OUT}$ is negative, and if $RF_{OUT} < RF_{LO} + IF_{DES}$, then $|IF_{OUT}| < |IF_{DES}|$, which produces the correct response as illustrated in EQ. 13, EQ. 14, and EQ. 15; however, if $RF_{OUT} > RF_{LO} + IF_{DES}$, then $|IF_{OUT}| > |IF_{DES}|$, which produces an incorrect response that results in $V_{ERR}$ being driven increasingly negative, which further increases $RF_{OUT}$ until a circuit enters a saturated state. Therefore, in one embodiment of the present invention, to prevent the incorrect response, during the FLL operating mode, an initial value of the first oscillator output frequency $RF_{OUT}$ is less than approximately a sum of the local oscillator frequency $RF_{LO}$ and the desired intermediate frequency $IF_{DES}$.

In an alternate embodiment of the RF mixer 52, the down-conversion frequency $IF_{MIXOD}$ produced from the difference of its input signals is different from EQ. 2 as shown in EQ. 16.

$$IF_{MIXOD} = RF_{OUT} - RF_{LO}. \qquad \text{EQ. 16}$$

The lowpass filter and limiter 54 removes the up-conversion frequency $RF_{MIXOU}$; therefore, only the down-conversion frequency $IF_{MIXOD}$ makes it through to the frequency reduced output signal FRO, as shown in EQ. 17.

$$IF_{OUT} = IF_{MIXOD} = RF_{OUT} - RF_{LO}. \qquad \text{EQ. 17}$$

Since $RF_{OUT}$ is equal to $RF_{DES}$ when $IF_{OUT}$ is equal $IF_{DES}$, then EQ. 18 is obtained by substitution into EQ. 17, and the magnitude of the FLL error signal FLLERR is zero as shown in EQ. 19.

$$IF_{DES} = RF_{DES} - RF_{LO}. \qquad \text{EQ. 18}$$

$$V_{ERR} = 0. \qquad \text{EQ. 19}$$

Since the frequency detector circuitry 22 measures frequency errors independent of phase differences, only the absolute values of $IF_{OUT}$ and $RF_{DES}$ influence $V_{ERR}$. The behavior of the variable frequency oscillator 12 in response to $IF_{OUT}$ and $V_{ERR}$ described is described by EQ. 20, EQ. 21, EQ. 22, and EQ. 23.

$$\text{If } |IF_{OUT}| < |IF_{DES}|, \text{ then } V_{ERR} = \text{positive}. \qquad \text{EQ. 20}$$

$$\text{If } V_{ERR} = \text{positive, then } RF_{OUT} \text{ is driven up}. \qquad \text{EQ. 21}$$

$$\text{If } |IF_{OUT}| > |IF_{DES}|, \text{ then } V_{ERR} = \text{negative}. \qquad \text{EQ. 22}$$

$$\text{If } V_{ERR} = \text{negative, then } RF_{OUT} \text{ is driven down}. \qquad \text{EQ. 23}$$

By examination of EQ. 17, if $RF_{OUT} > RF_{DES}$, then $IF_{OUT} > IF_{DES}$, which produces a negative FLL error signal FLLERR that drives $RF_{OUT}$ down, which is the correct response as illustrated in EQ. 24, EQ. 25, and EQ. 26.

$$\text{If } RF_{OUT} > RF_{DES}, \text{ then } IF_{OUT} > IF_{DES}. \qquad \text{EQ. 24}$$

$$\text{If } |IF_{OUT}| > |IF_{DES}|, \text{ then } V_{ERR} = \text{negative}. \qquad \text{EQ. 25}$$

$$\text{If } V_{ERR} = \text{negative, then } RF_{OUT} \text{ is driven down}. \qquad \text{EQ. 26}$$

Additionally, by examination of EQ. 17, if $RF_{OUT} < RF_{DES}$ and $RF_{OUT} < RF_{LO}$, then $IF_{OUT}$ is negative, and if $RF_{OUT} > RF_{LO} - IF_{DES}$, then $|IF_{OUT}| < |IF_{DES}|$, which produces a positive FLL error signal FLLERR that drives $RF_{OUT}$ up, which is the correct response as illustrated in EQ. 27, EQ. 28, and EQ. 29.

$$\text{If } RF_{OUT} < RF_{DES}, \text{ then } IF_{OUT} < IF_{DES}. \qquad \text{EQ. 27}$$

$$\text{If } |IF_{OUT}| < |IF_{DES}|, \text{ then } V_{ERR} = \text{positive}. \qquad \text{EQ. 28}$$

$$\text{If } V_{ERR} = \text{positive, then } RF_{OUT} \text{ is driven up}. \qquad \text{EQ. 29}$$

Further, by examination of EQ. 17, if $RF_{OUT} < RF_{DES}$ and $RF_{OUT} < RF_{LO}$, then $IF_{OUT}$ is negative, and if $RF_{OUT} > RF_{LO} - IF_{DES}$, then $|IF_{OUT}| < |IF_{DES}|$, which produces the correct response as illustrated in EQ. 27, EQ. 28, and EQ. 29; however, if $RF_{OUT} < RF_{LO} - IF_{DES}$, then $|IF_{OUT}| > |IF_{DES}|$, which produces an incorrect response that results in $V_{ERR}$ being driven increasingly negative, which further decreases $RF_{OUT}$ until a circuit enters a saturated state. Therefore, in one embodiment of the present invention, to prevent the incorrect response, during the FLL operating mode, an initial value of the first oscillator output frequency $RF_{OUT}$ is greater than a threshold value, which is approximately equal to the local oscillator frequency $RF_{LO}$ minus the desired intermediate frequency $IF_{DES}$.

Figure 10:
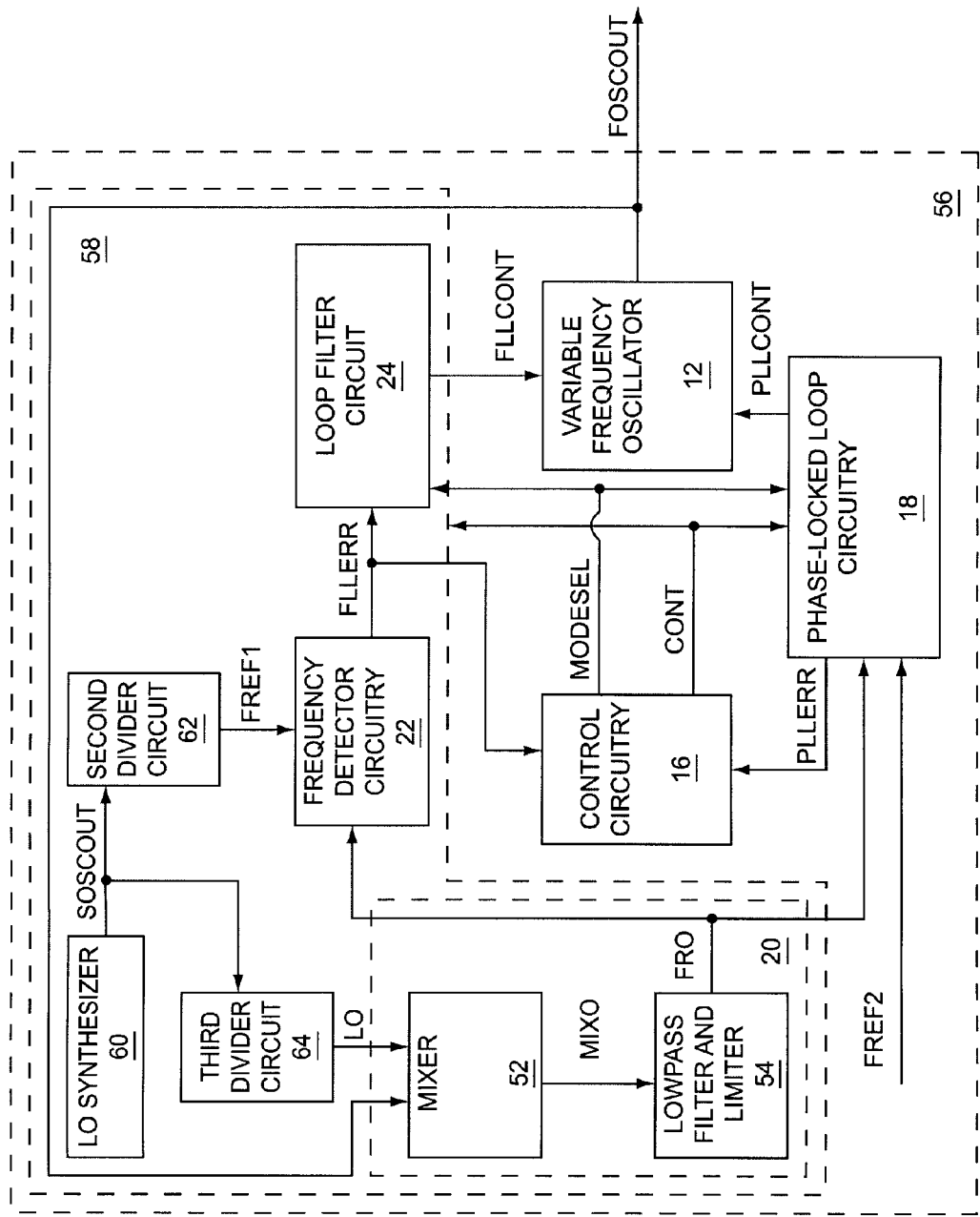
FIG. 10 shows a dual loop synthesizer, according to an alternate embodiment of the present invention.

FIG. 10 shows a dual loop synthesizer 56, according to an alternate embodiment of the present invention. The dual loop synthesizer 56 includes the variable frequency oscillator 12, the control circuitry 16, the phase-locked loop circuitry 18, and a dual loop frequency-locked loop circuit 58 instead of the frequency-locked loop circuitry 14 illustrated in FIG. 1. The dual loop frequency-locked loop circuit 58 includes the frequency detector circuitry 22, the loop filter circuit 24, the RF mixer 52, and the lowpass filter and limiter 54 illustrated in FIG. 9, and an LO synthesizer 60, a second divider circuit 62, and a third divider circuit 64. The LO synthesizer 60 provides a second oscillator output signal SOSCOUT to the second and third divider circuits 62, 64. The second divider circuit 62 divides the second oscillator output signal SOSCOUT to provide the first frequency reference signal FREF1. The third divider circuit 64 divides the second oscillator output signal SOSCOUT to provide the local oscillator signal LO. In an exemplary embodiment of the present invention, a frequency of the second oscillator output signal SOSCOUT is approximately two times the local oscillator frequency $RF_{LO}$. It will be appreciated by those skilled in the art that frequency dividers can be employed at different points in the FPLL synthesizer 10 without substantially modifying the operation of the system. The use of frequency dividers at different points in the system is optimized in the design process to make various design trade-offs for frequency of operation of the circuits affecting current drain, noise performance, and accuracy of the tuning algorithms. In an alternate embodiment of the present invention, the third divider circuit 64 is omitted and the second oscillator output signal SOSCOUT provides the local oscillator signal LO directly.

In one embodiment of the present invention, the LO synthesizer 60 may have a second loop FLL mode for coarse tuning and a second loop PLL mode for fine tuning. Additionally, the second loop FLL mode may be sub-divided into a second loop acquisition mode and a second loop average and interpolate mode. Coarse tuning of the variable frequency oscillator 12 may begin approximately upon or after completion of coarse tuning the LO synthesizer 60, fine tuning the LO synthesizer 60, the second loop FLL mode, the second loop acquisition mode, or the second loop PLL mode. Fine tuning of the variable frequency oscillator 12 may begin approximately upon or after completion of fine tuning the LO synthesizer 60, the second loop FLL mode, the second loop average and interpolate mode, or the second loop PLL mode. Components, such as capacitive elements, in a variable frequency oscillator in the LO synthesizer 60 may have matching characteristics with components in the variable frequency oscillator 12; therefore, an initial tuning value for the variable frequency oscillator 12 may be based on or equal to a completion tuning value of the LO synthesizer 60 upon completion of coarse tuning the LO synthesizer 60, fine tuning the LO synthesizer 60, the second loop FLL mode, the second loop acquisition mode, or the second loop PLL mode. Alternatively, coarse tuning of the variable frequency oscillator 12 may begin based on timing from tuning the LO synthesizer 60.

Figure 11:
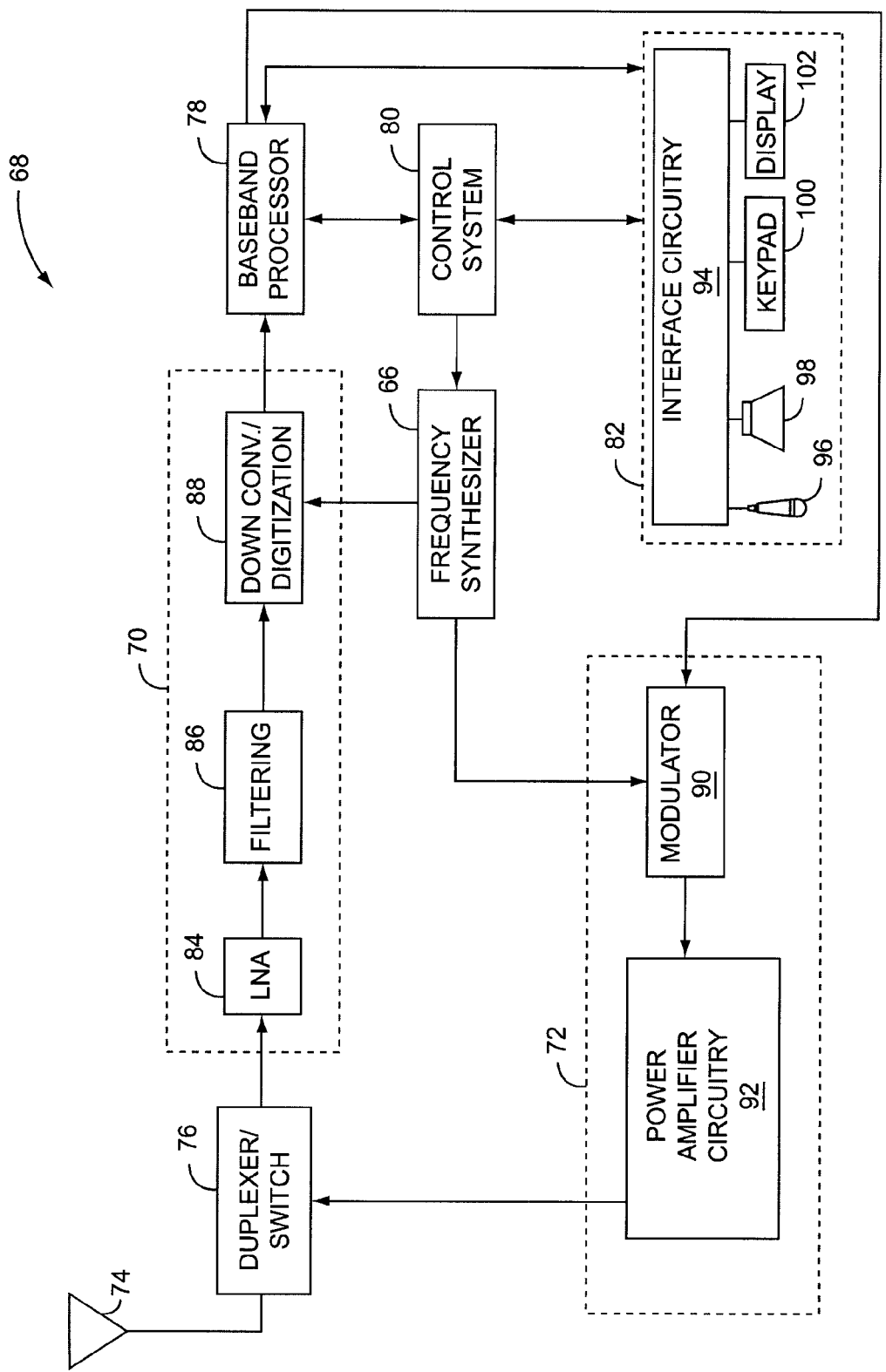
FIG. 11 shows an application example of the present invention used in a mobile terminal.

An application example of a FPLL synthesizer 10 is its use in a frequency synthesizer 66 in a mobile terminal 68. The basic architecture of the mobile terminal 68 is represented in FIG. 11 and may include a receiver front end 70, a radio frequency transmitter section 72, an antenna 74, a duplexer or switch 76, a baseband processor 78, a control system 80, the frequency synthesizer 66, and an interface 82. The receiver front end 70 receives information bearing radio frequency signals from one or more remote transmitters provided by a base station. A low noise amplifier (LNA) 84 amplifies the signal. A filter circuit 86 minimizes broadband interference in the received signal, while down conversion and digitization circuitry 88 down converts the filtered, received signal to an intermediate or baseband frequency signal, which is then digitized into one or more digital streams. The receiver front end 70 typically uses one or more mixing frequencies generated by the frequency synthesizer 66. The baseband processor 78 processes the digitized received signal to extract the information or data bits conveyed in the received signal. This processing typically comprises demodulation, decoding, and error correction operations. As such, the baseband processor 78 is generally implemented in one or more digital signal processors (DSPs).

On the transmit side, the baseband processor 78 receives digitized data, which may represent voice, data, or control information, from the control system 80, which it encodes for transmission. The encoded data is output to the transmitter 72, where it is used by a modulator 90 to modulate a carrier signal that is at a desired transmit frequency. Power amplifier circuitry 92 amplifies the modulated carrier signal to a level appropriate for transmission, and delivers the amplified and modulated carrier signal to the antenna 74 through the duplexer or switch 76.

A user may interact with the mobile terminal 68 via the interface 82, which may include interface circuitry 94 associated with a microphone 96, a speaker 98, a keypad 100, and a display 102. The interface circuitry 94 typically includes analog-to-digital converters, digital-to-analog converters, amplifiers, and the like. Additionally, it may include a voice encoder/decoder, in which case it may communicate directly with the baseband processor 78. The microphone 96 will typically convert audio input, such as the user's voice, into an electrical signal, which is then digitized and passed directly or indirectly to the baseband processor 78. Audio information encoded in the received signal is recovered by the baseband processor 78, and converted by the interface circuitry 94 into an analog signal suitable for driving the speaker 98. The keypad 100 and display 102 enable the user to interact with the mobile terminal 68, input numbers to be dialed, address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:

1. A radio frequency (RF) circuit comprising:
a first frequency-locked loop (FLL), which during a first FLL operating mode is adapted to:
receive a first reference signal having a first reference frequency;
provide a first frequency-reduced output signal having a first reduced output frequency, which is approximately equal to a first output frequency divided by a first constant; and
provide a first output signal having the first output frequency, which is based on a difference between the first reduced output frequency and the first reference frequency;
a first phase-locked loop (PLL), which during a first PLL operating mode is adapted to:
receive a second reference signal; and provide the first output signal, which is based on a phase difference between the first output signal and the second reference signal, wherein the first FLL provides coarse tuning of a frequency of the first output signal during the first FLL operating mode and the first PLL provides fine tuning of a frequency of the first output signal during the first PLL operating mode;

a first variable frequency oscillator adapted to:
  receive a first control signal and a second control signal; and
  provide the first output signal having the first output frequency, which is based on at least one of the first control signal and the second control signal;

a first frequency reduction circuit, which during the first FLL operating mode is adapted to:
  receive the first output signal; and
  provide the first frequency-reduced output signal;

a first frequency detector circuit, which during the first FLL operating mode is adapted to:
  receive the first frequency-reduced output signal and the first reference signal; and
  provide a first frequency error signal, which is based on the difference between the first reduced output frequency and the first reference frequency;

a first loop filter circuit, which during the first FLL operating mode is adapted to:
  receive and filter the first frequency error signal to create a first filtered frequency error signal; and
  provide the first control signal based on the first filtered frequency error signal; and PLL circuitry, which during the first PLL operating mode is adapted to:
  receive one of the first output signal and the first frequency-reduced output signal, and a second reference signal having a second reference frequency; and
  provide the second control signal based on the one of the first output signal and the first frequency-reduced output signal, and further based on the second reference signal.

2. The RF circuit of claim 1 wherein the second reference signal is approximately identical to the first reference signal.

3. The RF circuit of claim 1 wherein:
during the PLL operating mode:
  the first frequency reduction circuit is further adapted to:
    receive the first output signal; and
    provide the first frequency-reduced output signal having the first reduced output frequency, which is approximately equal to the first output frequency divided by the first constant; and
  the PLL circuitry is further adapted to:
    receive the first frequency-reduced output signal; and
    provide the second control signal further based on the first frequency-reduced output signal.

4. The RF circuit of claim 1 wherein the first frequency reduction circuit comprises a first divider circuit adapted to receive the first output signal and provide the first frequency-reduced output signal based on frequency division of the first output signal.

5. The RF circuit of claim 1 wherein the first frequency reduction circuit comprises:
  an RF mixer adapted to receive the first output signal and a local oscillator (LO) signal having an LO frequency, and provide an RF mixer output signal based on mixing the first output signal and the LO signal; and
  a mixer filter circuit adapted to receive the RF mixer output signal and provide the first frequency-reduced output signal based on filtering the RF mixer output signal.

6. The RF circuit of claim 5 wherein an initial value of the first output frequency is less than approximately a sum of the LO frequency and a desired intermediate frequency.

7. The RF circuit of claim 5 wherein an initial value of the first output frequency is greater than a threshold value, which is approximately equal to a sum of the LO frequency minus a desired intermediate frequency.

8. The RF circuit of claim 5 further comprising an LO synthesizer adapted to provide a second output signal having a second output frequency, wherein the LO signal and the first reference signal are based on the second output signal.

9. The RF circuit of claim 8 wherein coarse tuning the first variable frequency oscillator begins approximately upon or after completion of coarse tuning the LO synthesizer.

10. The RF circuit of claim 8 wherein coarse tuning of the first variable frequency oscillator begins based on timing from tuning the LO synthesizer.

11. The RF circuit of claim 8 wherein coarse tuning the first variable frequency oscillator begins approximately before completion of fine tuning the LO synthesizer.

12. The RF circuit of claim 8 wherein an initial tuning value for the first variable frequency oscillator is based on a completion tuning value of the LO synthesizer.

13. A radio frequency (RF) circuit comprising:
a first frequency-locked loop (FLL) comprising discrete tuning elements, and during a first FLL operating mode is adapted to:
  receive a first reference signal having a first reference frequency;
  select at least one of the discrete tuning elements based on a first output frequency and the first reference frequency; and
  provide a first output signal having the first output frequency, which is based on the select at least one of the discrete tuning elements;

a first phase-locked loop (PLL), which during a first PLL operating mode is adapted to:
  receive a second reference signal; and
  provide the first output signal, which is based on a phase difference between the first output signal and the second reference signal, wherein the first FLL provides coarse tuning of a frequency the first FLL operating mode and the first PLL provides fine tuning of a frequency of the first output signal during the first PLL operating mode;

a first variable frequency oscillator:
  comprising the discrete tuning elements; and
  adapted to:
    receive a first control signal and a second control signal; and
    provide the first output signal having the first output frequency, which is based on at least one of the first control signal and the second control signal,
  wherein the select at least one of the discrete tuning elements is based on the first control signal;

a first frequency detector circuit, which during the first FLL operating mode is adapted to:
  receive one of a derived signal based on the first output signal having a derived output frequency and the first output signal;
  receive the first reference signal; and
  provide a first frequency error signal, which is based on a difference between one of the derived output frequency and the first output frequency, and the first reference frequency;

a first loop filter circuit, which during the first FLL operating mode is adapted to:

receive and filter the first frequency error signal to create a first filtered frequency error signal; and provide the first control signal based on the first filtered frequency error signal; and PLL circuitry, which during the first PLL operating mode is adapted to:

receive one of the first output signal and the derived output signal, and the second reference signal having a second reference frequency; and provide the second control signal based on the one of the first output signal and the derived output signal, and further based on the second reference signal.

14. The RF circuit of claim 13 wherein the second reference signal is approximately identical to the first reference signal.

15. The RF circuit of claim 13 wherein the first frequency detector circuit comprises:

a digital sequence generating circuit adapted to provide a sequence count based on the one of the first output signal and the derived output signal;

a digital sequence decoder adapted to receive and decode the sequence count to provide a binary decoded count signal; and a first difference circuit adapted to receive a first value of the binary decoded count signal and a second value of the binary decoded count signal, wherein the first frequency error signal is further based on a second difference between the first value and the second value.

16. The RF circuit of claim 15 wherein the digital sequence generating circuit is adapted to receive a clock signal, such that the sequence count changes by a single-bit for each clock from the clock signal.

17. The RF circuit of claim 16 wherein the digital sequence generating circuit comprises a Gray code counter and the digital sequence decoder comprises a Gray code decoder.

18. The RF circuit of claim 13 wherein the first loop filter circuit comprises a gain circuit adapted to receive a first loop filter signal based on the first frequency error signal, and provide an amplified first loop filter signal, wherein a gain factor times a magnitude of the first loop filter signal is approximately equal to a magnitude of the amplified first loop filter signal, and the first filtered frequency error signal is based on the amplified first loop filter signal.

19. The RF circuit of claim 18 wherein the first FLL operating mode further comprises a first acquisition mode and a first average and interpolate mode, and a magnitude of the gain factor during the first acquisition mode is greater than a magnitude of the gain factor during the first average and interpolate mode.

20. The RF circuit of claim 19 wherein the first control signal is a digital signal having one of a plurality of digital values, which changes by a first amount during the first acquisition mode and by a second amount during the first average and interpolate mode.

21. The RF circuit of claim 13 wherein the first loop filter circuit comprises an adder adapted to receive a first loop filter signal based on the first frequency error signal and a bias signal, and adapted to provide a second loop filter signal based on the first loop filter signal and the bias signal, wherein the first filtered frequency error signal is based on the second loop filter signal; and when the first frequency error signal is approximately zero, a change in a magnitude of the second loop filter signal is based on the bias signal.

* * * * *